US009565762B1

(12) United States Patent
Azeroual et al.

(10) Patent No.: US 9,565,762 B1
(45) Date of Patent: Feb. 7, 2017

(54) POWER DELIVERY NETWORK IN A PRINTED CIRCUIT BOARD STRUCTURE

(71) Applicant: Marvell Israel (M.I.S.L) Ltd., Yokneam (IL)

(72) Inventors: Dan Azeroual, Kiriat Ata (IL); Eldad Bar-Lev, Kiryat Tivon (IL)

(73) Assignee: Marvell Israel (M.I.S.L) Ltd., Yokneam (IL)

( * ) Notice: Subject to any disclaimer, the term of this patent is extended or adjusted under 35 U.S.C. 154(b) by 109 days.

(21) Appl. No.: 14/560,562

(22) Filed: Dec. 4, 2014

Related U.S. Application Data

(60) Provisional application No. 61/912,874, filed on Dec. 6, 2013.

(51) Int. Cl.
*H05K 1/11* (2006.01)
*H05K 3/32* (2006.01)

(52) U.S. Cl.
CPC ............... *H05K 1/113* (2013.01); *H05K 3/32* (2013.01)

(58) Field of Classification Search
CPC  H05K 2201/093; H05K 1/113; H05K 1/0218; H05K 3/32
See application file for complete search history.

(56) References Cited

U.S. PATENT DOCUMENTS

| 5,708,296 A * | 1/1998 | Bhansali | H01L 23/50 257/691 |
| 6,576,869 B1 * | 6/2003 | Gower | H05K 3/0032 219/121.7 |
| 7,069,650 B2 * | 7/2006 | Wyrzykowska | H05K 1/115 29/593 |
| 2002/0139578 A1 * | 10/2002 | Alcoe | H01L 23/49822 174/262 |
| 2004/0012938 A1 * | 1/2004 | Sylvester | H01L 21/4857 361/794 |
| 2004/0256731 A1 * | 12/2004 | Mao | C08L 65/00 257/773 |

(Continued)

*Primary Examiner* — Steven T Sawyer

(57) ABSTRACT

Aspects of the disclosure provide a printed circuit board (PCB) structure. The PCB structure includes a plurality of dielectric layers including an outer layer, a second layer disposed immediately below the outer layer, at least one first power plane disposed on at least one first internal layer of the PCB structure, and at least one first ground plane disposed on at least one second internal layer of the PCB structure. The PCB structure further includes an array of buried vias passing through at least the second layer configured to respectively connect power pads disposed on the second layer to the at least one first power plane and to connect ground pads disposed on the second layer to the at least one first ground plane. The array of buried vias is defined by columns of pads in which a respective column includes either power pads or ground pads, columns of power pads alternate with columns of ground pads, and pads of at least one of a column of power pads and a column of ground pads are staggered with respect to other pads of the at least one of the column of power pads and the column of ground pads. The PCB structure further includes an array of outer layer vias passing through the outer layer and configured to provide an electrical connection between one or more circuit components disposed on the outer layer and the second layer.

22 Claims, 5 Drawing Sheets

(56) References Cited

U.S. PATENT DOCUMENTS

2006/0055049 A1* 3/2006 Nelson .............. H01L 23/49838
  257/774
2011/0110061 A1* 5/2011 Leung .................... H05K 1/115
  361/783
2012/0139108 A1* 6/2012 Kim .................. H01L 23/49822
  257/738

* cited by examiner

POWER DELIVERY NETWORK IN A PRINTED CIRCUIT BOARD STRUCTURE

INCORPORATION BY REFERENCE

This present disclosure claims the benefit of U.S. Provisional Application No. 61/912,874, "Low Cost Cellular PCB PDN Pattern" filed on Dec. 6, 2013, which is incorporated herein by reference in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

A printed circuit board (PCB) structure includes a plurality of dielectric layers. A plurality of electric components are disposed on and within the plurality of dielectric layers. Electronic devices face an increasing difficulty in providing sufficient power density to components disposed on an outer layer of the PCB structure.

SUMMARY

Aspects of the disclosure provide a printed circuit board (PCB) structure. The PCB structure includes a plurality of dielectric layers including an outer layer, a second layer disposed immediately below the outer layer, at least one first power plane disposed on at least one first internal layer of the PCB structure, and at least one first ground plane disposed on at least one second internal layer of the PCB structure. The PCB structure further includes an array of buried vias passing through at least the second layer configured to respectively connect power pads disposed on the second layer to the at least one first power plane and to connect ground pads disposed on the second layer to the at least one first ground plane.

The array of buried vias is defined by columns of pads in which a respective column includes either power pads or ground pads, columns of power pads alternate with columns of ground pads, and pads of at least one of a column of power pads and a column of ground pads are staggered with respect to other pads of the at least one of the column of power pads and the column of ground pads. The PCB structure further includes an array of outer layer vias passing through the outer layer and configured to provide an electrical connection between one or more circuit components disposed on the outer layer and the second layer.

In an embodiment, the pads of the column of power pads are staggered with respect to the other pads of the column of power pads such that a power pad in the column of staggered power pads is offset from a preceding power pad in the column of staggered power pads, and the power pad in the column of staggered power pads is offset from a subsequent power pad in the column of staggered power pads.

Further, in an example, the preceding power pad in the column of staggered power pads is not offset with respect to the subsequent power pad in the column of staggered power pads.

In an embodiment, the pads of the column of ground pads are staggered with respect to the other pads of the column of ground pads such that a ground pad in the column of staggered ground pads is offset from a preceding ground pad in the column of staggered ground pads, and the ground pad in the column of staggered ground pads is offset from a subsequent ground pad in the column of staggered ground pads.

Further, in an example, the preceding ground pad in the column of staggered ground pads is not offset with respect to the subsequent ground pad in the column of staggered ground pads.

According to an aspect of the disclosure, for a first power pad in the column of staggered power pads, ground pads in a pair of ground pads in a column of ground pads, the column of ground pads being adjacent to the column of staggered power pads, are substantially equidistant to the first power pad.

According to an aspect of the disclosure, for a first ground pad in the column of staggered ground pads, power pads in a pair of power pads in a column of power pads, the column of power pads being adjacent to the column of staggered ground pads, are substantially equidistant to the first ground pad.

Further, in an example, the PCB structure includes a buried power via for each of the power pads, the buried power via being configured to connect a respective power pad to the at least one first power plane; and a buried ground via for each of the ground pads, the buried ground via being configured to connect a respective ground pad to the at least one first ground plane.

In an embodiment, the PCB structure includes an outer layer power via passing through the outer layer configured to contact a respective power pad on the second layer, the outer layer power via positioned within the outer layer according to a position of the one or more circuit components disposed on the outer layer and independent of a buried power via passing through the second layer corresponding to the respective power pad on the second layer; and an outer layer ground via passing through the outer layer configured to contact a respective ground pad on the second layer, the outer layer ground via positioned within the outer layer according to the position of the one or more circuit components disposed on the outer layer and independent of a buried ground via passing through the second layer corresponding to the respective ground pad on the second layer.

Aspects of the disclosure provide a method. The method includes electrically connecting one or more circuit components, disposed on an outer layer of a printed circuit board (PCB) structure including a plurality of dielectric layers, to a second layer disposed immediately below the outer layer via an array of outer layer vias passing through the outer layer, and connecting power pads disposed on the second layer to at least one first power plane disposed on at least one first internal layer of the PCB structure and connecting ground pads disposed on the second layer to at least one first ground plane disposed on at least one second internal layer of the PCB structure via an array of buried vias passing through at least the second layer.

The array of buried vias is defined by columns of pads in which a respective column includes either power pads or ground pads, columns of power pads alternate with columns of ground pads, and pads of at least one of a column of power pads and a column of ground pads are staggered with respect to other pads of the at least one of the column of power pads and the column of ground pads.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1:
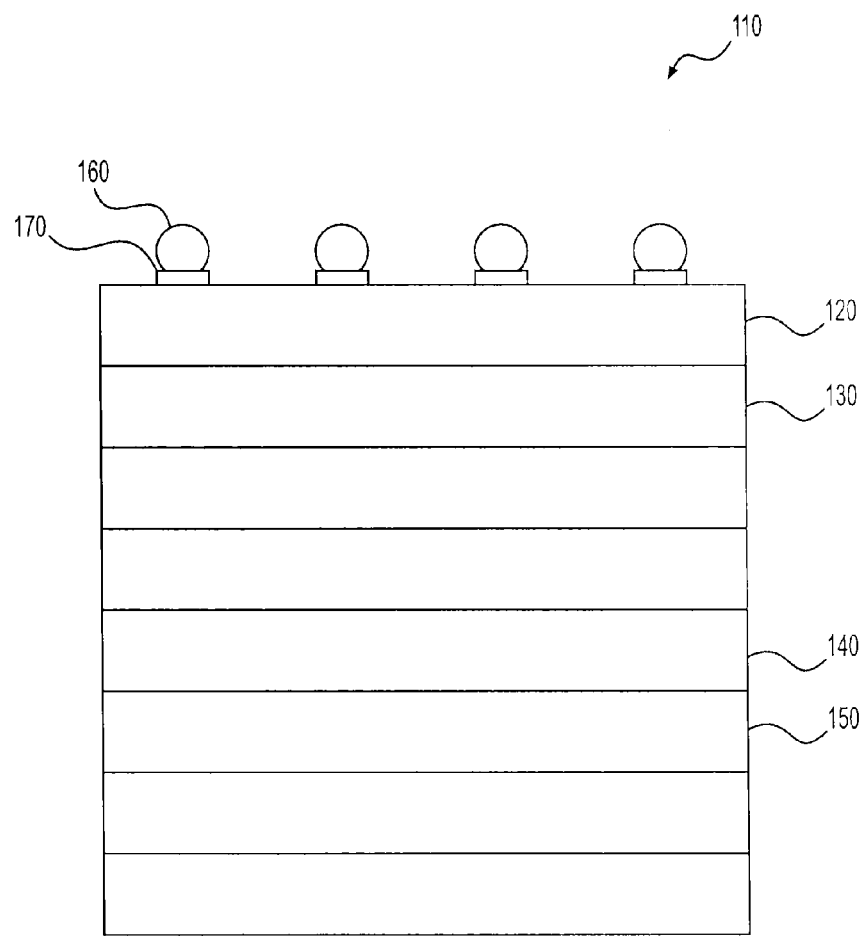
FIG. 1 shows a side view of a printed circuit board (PCB) structure according to an embodiment of the disclosure.

FIG. 1 shows a printed circuit board (PCB) structure 110 according to an embodiment of the disclosure. PCB structure 110 is a 1-6-1 stack-up structure, which includes eight dielectric layers. The eight dielectric layers include an outer layer 120, a second layer 130 disposed immediately below the outer layer 120, a first internal layer 140, and a second internal layer 150. The first internal layer 140 and the second internal layer 150 are internal layers of the PCB structure 110 disposed below the second layer 130. Circuit components 160 and 170 are disposed on the outer layer 120.

In an embodiment, circuit components 160 and 170 provide an electrical connection between a circuit component internal to the PCB structure 110 (described later) and an electronic device external to the PCB structure 110 (not shown). In an example, circuit component 160 is a solder ball and circuit component 170 is a solder ball pad. Circuit component 170 is not limited to a solder ball pad. In an example, circuit component 170 is any component suitable to provide the electrical connection between the circuit component internal to the PCB structure 110 and circuit component 160. Circuit component 160 is not limited to a solder ball. In an example, circuit component 160 is any component suitable to provide the electrical connection between the electronic device external to the PCB structure 110 and circuit component 170. In an example, circuit component 170 is not necessary for the electrical connection between the circuit component internal to the PCB structure 110 and circuit component 160.

In an example, the electronic device external to the PCB structure 110 is a ball grid array (BGA) package where circuit component 160 forms a ball of the BGA. The BGA package includes an integrated circuit (IC) chip. In an example, the IC chip includes various circuits for signal processing. In embodiments, circuit component 160 provides an electrical connection from the circuit component internal to the PCB structure 110 to the IC chip and its various circuits.

The PCB structure 110 is not limited to the 1-6-1 stack-up structure. In an example, the PCB structure 110 includes more than eight dielectric layers. In an example, the PCB structure 110 includes less than eight dielectric layers.

Figure 2:
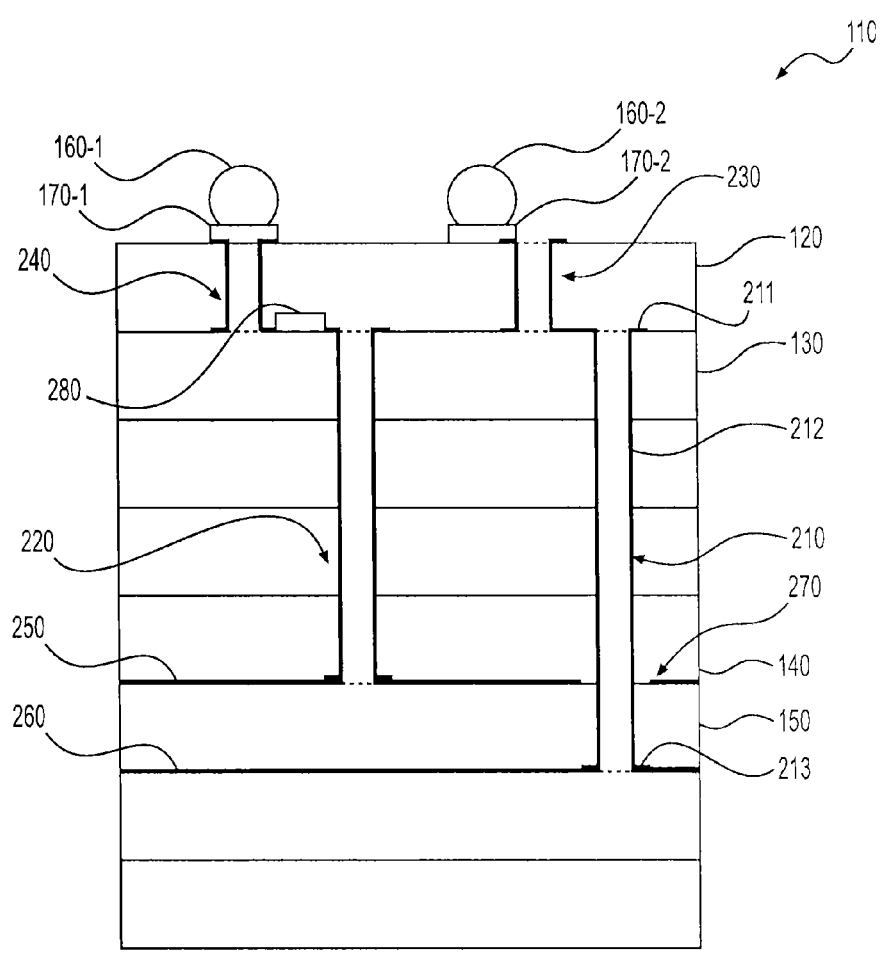
FIG. 2 shows a cross section of the PCB structure of FIG. 1 according to an embodiment of the disclosure.

FIG. 2 shows a cross section of the PCB structure 110 according to an embodiment of the disclosure. In an example, PCB structure 110 includes a buried power via 210, a buried ground via 220, an outer layer power via 230, and an outer layer ground via 240. In an example, the buried power via 210 and the buried ground via 220 are buried in at least the second layer 130 of the PCB structure. In an example, the buried power via 210 is buried in the second internal layer 150. The buried power via 210 passes through layers of the PCB structure 110 disposed between the second layer 130 and the second internal layer 150. In an example, the buried ground via 220 is buried in the first internal layer 140. The buried ground via 220 passes through layers of the PCB structure 110 disposed between the second layer 130 and the first internal layer 140. In an example, the outer layer power via 230 and the outer layer ground via 240 are buried in the outer layer 120.

In an embodiment, PCB structure 110 includes a ground plane 250 disposed on the first internal layer 140 and a power plane 260 disposed on second internal layer 150. The ground plane 250 provides a ground connection to components of the PCB structure 110. In an example, the ground plane 250 is a conductive layer disposed on the first internal layer 140. The ground plane 250 is not limited to the conductive layer. In an example, the ground plane 250 is any component suitable to provide the ground connection to the components of the PCB structure 110. In an example, the PCB structure 110 includes a plurality of ground planes 250.

The power plane 260 provides a power connection to components of the PCB structure 110. In an example, the power plane 260 is a conductive layer disposed on the second internal layer 150. The power plane 260 is not limited to the conductive layer. In an example, power plane 260 is any component suitable to provide the power connection to the components of the PCB structure 110. In an example, the PCB structure 110 includes a plurality of power planes 260.

In an embodiment, the PCB structure 110 includes a ground circuit component 160-1, a ground circuit component 170-1, a power circuit component 160-1, and a power circuit component 170-1. The ground circuit components 160-1 and 170-1 provide a ground connection between the ground plane 250 and the electronic device external to the PCB structure 110. In an example, the ground circuit component 160-1 is a solder ball and the ground circuit component 170-1 is a solder ball pad.

The ground circuit component 170-1 is not limited to a solder ball pad. In an example, the ground circuit component 170-1 is any component suitable to provide the ground connection between the ground plane 250 and the ground circuit component 160-1. The ground circuit component 160-1 is not limited to a solder ball. In an example, the ground circuit component 160-1 is any component suitable to provide the ground connection between the electronic device external to the PCB structure 110 and the ground circuit component 170-1. In an example, the ground circuit component 170-1 is not necessary for the ground connection between the ground plane 250 and the ground circuit component 160-1.

The power circuit components 160-2 and 170-2 provide a power connection between the power plane 260 and the electronic device external to the PCB structure 110. In an example, the power circuit component 160-2 is a solder ball and the power circuit component 170-2 is a solder ball pad. The power circuit component 170-2 is not limited to a solder ball pad. In an example, the power circuit component 170-2 is any component suitable to provide the power connection between the power plane 260 and the power circuit component 160-2. The power circuit component 160-2 is not limited to a solder ball. In an example, the power circuit component 160-1 is any component suitable to provide the power connection between the electronic device external to the PCB structure 110 and the power circuit component 170-2. In an example, the power circuit component 170-2 is not necessary for the power connection between the power plane 260 and the power circuit component 160-2.

In an embodiment, the buried power via 210 includes top pad 211, bore 212, and bottom pad 213. The bore 212 includes suitable conductive material which provides an electrical connection between the top pad 211 and the bottom pad 213. In an example, the bore 212 is plated with a conductive material, such as copper, for example. In an example, the buried power via 210 includes an anti-pad 270. The anti-pad 270 is an aperture in the ground plane 140 sized such that ground plane 140 does not make an electrical connection with the bore 212 of the buried power via 210. The buried power via 210 is not limited to this structure. In an example, the buried power via 210 has any structure suitable to provide the power connection from the power plane 260.

In an embodiment, the buried ground via 220 has a structure similar to that of the buried power via 210, but the structure of the buried ground via 220 is not limited to this structure. In an example, the buried ground via 220 has any structure suitable to provide the ground connection from the ground plane 250. In an embodiment, the outer layer power via 230 has a structure similar to that of the buried power via 210, but the structure of the outer layer power via 230 is not limited to this structure. In an example, the outer layer power via 230 has any structure suitable to provide the power connection through the outer layer 120. In an embodiment, the outer layer ground via 240 has a structure similar to that of the buried power via 210, but the structure of the outer layer ground via 240 is not limited to this structure. In an example, the outer layer ground via 240 has any structure suitable to provide the ground connection through the outer layer 120.

In an embodiment, the power circuit component 160-2 is electrically connected to the power plane 260 to provide the power connection between the electronic device external to the PCB structure 110 and the power plane 260. In an example, the bottom pad 213 is electrically connected to the power plane 260, the bore 212 is electrically connected to the bottom pad 213, and the top pad 211 is electrically connected to the bore 212. In an example, a bottom pad of the outer layer power via 230 is electrically connected to the top pad 211, a bore of the outer layer power via 230 is electrically connected to the bottom pad of the outer layer power via 230, and a top pad of the outer layer power via 230 is electrically connected to the bore of the outer layer power via 230. In an example, the power circuit component 170-2 is electrically connected to the top pad of the outer layer power via 230 and the power circuit component 160-2 is electrically connected to the power circuit component 170-2.

In an example, the power circuit component 170-2 is electrically connected to the top pad of the outer layer power via 230, but is offset from the outer layer power via 230. The power circuit component 170-2 is not limited to this position. In an example, the power circuit component 170-2 is disposed on the outer layer power via 230.

In an embodiment, the ground circuit component 160-1 is electrically connected to the ground plane 250 to provide the ground connection between the electronic device external to the PCB structure 110 and the ground plane 250. In an example, a bottom pad of the buried ground via 220 is electrically connected to the ground plane 250, a bore of the buried ground via 220 is electrically connected to the bottom pad of the buried ground via 220, and a top pad of the buried ground via 220 is electrically connected to the bore of the buried ground via 220. In an example, a bottom pad of the outer layer ground via 240 is electrically connected to the top pad of the buried ground via 220 via an interconnect 280, a bore of the outer layer ground via 240 is electrically connected to the bottom pad of the outer layer ground via 240, and a top pad of the outer layer ground via 240 is electrically connected to the bore of the outer layer ground via 240. In an example, the interconnect 280 is any suitable component to electrically connect the top pad of the buried ground via 220 and the bottom pad of the outer layer ground via 240. In an example, the ground circuit component 170-1 is electrically connected to the top pad of the outer layer ground via 240 and the ground circuit component 160-1 is electrically connected to the ground circuit component 170-1.

In an example, the ground circuit component 170-1 is disposed on the outer layer ground via 240. The ground circuit component 170-1 is not limited to this position. In an example, the ground circuit component 170-1 is offset from the outer layer ground via 240 and electrically connected to the top pad of the outer layer ground via 240.

The PCB structure 110 is not limited to the buried power via 210, the buried ground via 220, the outer layer power via 230, the outer layer ground via 240, the power circuit components 160-2 and 170-2, and the ground circuit components 160-1 and 170-1. In an example, the PCB structure 110 includes a plurality of the buried power vias 210 and a plurality of the buried ground vias 220 forming an array buried in at least the second layer 130. In an example, the PCB structure 110 includes a plurality of the outer layer power vias 230 and a plurality of the outer layer ground vias 240 forming an array buried in the outer layer 120. In an example, the PCB structure 110 includes a plurality of the ground circuit components 160-1 and 170-1 and a plurality of the power circuit components 160-2 and 170-2 forming an array disposed on the outer layer 120.

In an embodiment, the placement of the plurality of the outer layer power vias 230 buried in the outer layer 120 and the placement of the plurality of the power circuit components 160-2 and 170-2 disposed on the outer layer 120 is based upon the need for the power connection between the electronic device external to the PCB structure 110 and the power plane 260. In an example, each of the plurality of the power circuit components 170-2 are electrically connected to a respective one of the plurality of the outer layer power vias 230, the respective one of the plurality of the outer layer power vias 230 is connected to a respective one of the plurality of the buried power vias 210, and the respective one of the plurality of the buried power vias 210 is connected to the power plane 260.

In an embodiment, the placement of the plurality of the outer layer ground vias 240 buried in the outer layer 120 and the placement of the plurality of the ground circuit components 160-1 and 170-1 disposed on the outer layer 120 is based upon the need for the ground connection between the electronic device external to the PCB structure 110 and the ground plane 250. In an example, each of the plurality of the ground circuit components 170-1 are electrically connected to a respective one of the plurality of the outer layer ground vias 240, the respective one of the plurality of the outer layer ground vias 240 is connected to a respective one of the plurality of the buried ground vias 220, and the respective one of the plurality of the buried ground vias 220 is connected to the ground plane 250.

In an embodiment, the plurality of the buried power vias 210 and the plurality of the buried ground vias 220 forming the array buried in at least the second layer 130 form a power delivery network delivering power from within the internal structure of the PCB structure 110 to the top of the second layer 130. In an example, the plurality of buried power vias 210 provide an electrical connection between the power plane 260 disposed on the second internal layer 150 and the top of second layer 130. In an example, the plurality of buried ground vias 220 provide an electrical connection between the ground plane 250 disposed on the first internal layer 140.

In an embodiment, the plurality of the outer layer power vias 230 buried in the outer layer 120 are positioned within the outer layer 120 according to a position of the plurality of the power circuit components 160-2 and 170-2 disposed on the outer layer 120. In an example, the plurality of the power circuit components 160-2 and 170-2 disposed on the outer layer 120 are positioned on the outer layer 120 depending on the power needs of the electronic device external to the PCB structure 110. In an example, the plurality of the outer layer power vias 230 buried in the outer layer 120 are positioned within the outer layer 120 independent of positions of the plurality of the buried power vias 210 passing through the second layer 130. In an example, the plurality of the outer layer power vias 230 buried in the outer layer 120 are positioned on the outer layer 120 depending on the power needs of the electronic device external to the PCB structure 110.

In an embodiment, the plurality of the outer layer ground vias 240 buried in the outer layer 120 are positioned within the outer layer 120 according to a position of the plurality of the ground circuit components 160-1 and 170-1 disposed on the outer layer 120. In an example, the plurality of the ground circuit components 160-1 and 170-1 disposed on the outer layer 120 are positioned on the outer layer 120 depending on the ground needs of the electronic device external to the PCB structure 110. In an example, the plurality of the outer layer ground vias 240 buried in the outer layer 120 are positioned within the outer layer 120 independent of positions of the plurality of the buried ground vias 220 passing through the second layer 130. In an example, the plurality of the outer layer ground vias 240 buried in the outer layer 120 are positioned on the outer layer 120 depending on the ground needs of the electronic device external to the PCB structure 110.

Figure 3:
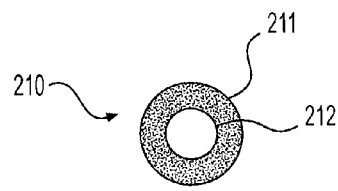
FIG. 3 shows a plan view of the buried power via according to an embodiment of the disclosure.

FIG. 3 shows a plan view of the buried power via 210 according to an embodiment of the disclosure. The plan view is as seen looking down on the second layer 130. The bore 212 extends into the page and is connected to and surrounded by the top pad 211. In an embodiment, the bore 212 and the top pad 211 are substantially circular. The buried power via 210 is not limited to this structure. In an example, the buried power via 210 is of any suitable structure to pass through at least the second layer 130 and provide the power connection between the power plane 260 and the outer layer power via 230.

In an embodiment, the buried ground via 220 has a structure similar to that of the buried power via 210, but the structure of the buried ground via 220 is not limited to this structure. In an example, the buried ground via 220 has any structure suitable to pass through at least the second layer 130 and provide the ground connection between the ground plane 250 and the outer layer ground via 240

Figure 4:
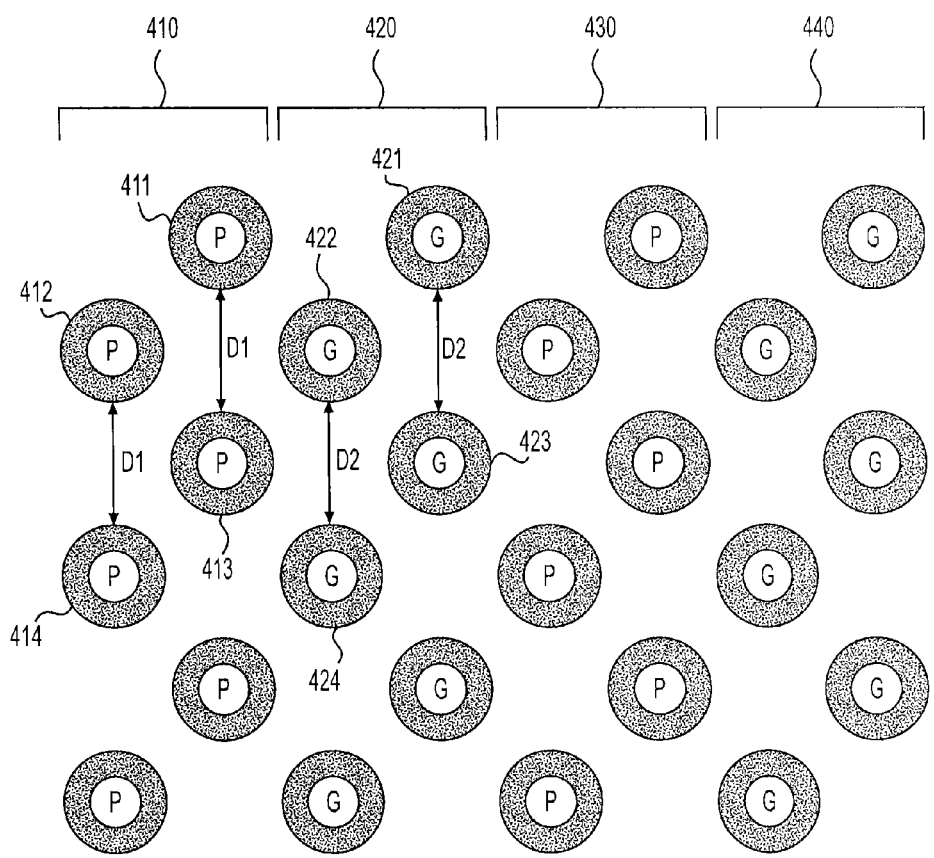
FIG. 4 shows a plan view of a plurality of pads according to an embodiment of the disclosure.

FIG. 4 shows a plan view of a plurality of pads according to an embodiment of the disclosure. The plan view is as seen looking down on the second payer 130. In an embodiment, the plurality of pads includes a plurality of power pads P and a plurality of ground pads G. In an example, each of the plurality of power pads P corresponds to a respective buried power via 210 and each of the plurality of power pads G is corresponds to a respective buried ground via 220. In an example, each of respective buried power vias 210 and each of the respective buried ground vias 220 together make up the array buried in at least the second layer 130 that forms the power delivery network delivering power from within the internal structure of the PCB structure.

In an embodiment, the plurality of power pads P are defined by a first column of power pads 410 and a second column of power pads 430. The plurality of ground pads G are defined by a first column of ground pads 420 and a second column of ground pads 440. In an example, the plurality of power pads P includes more than two columns of power pads and the plurality of ground pads G includes more than two columns of ground pads.

In an embodiment, the first and second columns of power pads 410 and 430 alternate with the first and second columns of ground pads 420 and 440. In an example, the first column of ground pads 420 is disposed between the first and the second columns of power pads 410 and 430. The second column of power pads 430 is disposed between the first and the second columns of ground pads 420 and 440.

In an example, power pads of the first column of power pads 410 are staggered with respect to other power pads of the first column of power pads 410. Ground pads of the first column of ground pads 420 are staggered with respect to other ground pads of the first column of ground pads 420. Power pads of the second column of power pads 430 are staggered with respect to other power pads of the second column of power pads 430. Ground pads of the second column of ground pads 440 are staggered with respect to other ground pads of the second column of ground pads 440.

In an embodiment, in the first column of power pads 410, a power pad 412 is offset from a power pad 411 and the power pad 412 is offset from a power pad 413. In an example, the power pad 411 and the power pad 413 are offset from the power pad 412 for substantially a same amount and in a same first direction with respect to a first imaginary line (not shown) passing vertically through a center of the power pad 412. In an example, the power pad 411 and the power pad 413 are not offset with respect to one another. In an example, a second imaginary line (not shown) passes through centers of the power pad 411 and the power pad 413. In an example, the power pad 411 is disposed above the power pad 412 and the power pad 413 is disposed below the power pad 412. In the context of this disclosure, substantially is intended to mean essentially, basically, significantly, fundamentally, or for all intents a purposes, as well as that which one of ordinary skill in the art at the time of invention would understand it to mean.

In an example, in the first column of power pads 410, the power pad 413 is offset from the power pad 412 and the power pad 413 is offset from a power pad 414. In an example, the power pad 412 and the power pad 414 are offset from the power pad 413 for substantially the same amount and in a same second direction with respect to the second imaginary line. In an example, the power pad 412 and the power pad 414 are not offset with respect to one another. In an example, the first imaginary line passes through a center of the power pad 414. In an example, the power pad 412 is disposed above the power pad 413 and the power pad 414 is disposed below the power pad 413. In an example, the second direction is opposite the first direction.

In an example, a distance D1 taken along the second imaginary line between the power pad 411 and the power pad 413 is substantially equal to a distance D1 taken along the first imaginary line between the power pad 412 and the power pad 414. In an example, in the first column of power pads 410, each grouping of four successive power pads follow the structure of power pads 411-414. In an example, power pads of the second column of power pads 430 have the same structure as the power pads of the first column of power pads 410.

In an embodiment, in the first column of ground pads 420, a ground pad 422 is offset from a ground pad 421 and the ground pad 422 is offset from a ground pad 423. In an example, the ground pad 421 and the ground pad 423 are offset from the ground pad 422 for substantially the same amount and in the same first direction with respect to a third imaginary line (not shown) passing vertically through a center of the ground pad 422. In an example, the ground pad 421 and the ground pad 423 are not offset with respect to one another. In an example, a fourth imaginary line (not shown) passes through centers of the ground pad 421 and the ground pad 423. In an example, the ground pad 421 is disposed above the ground pad 422 and the ground pad 423 is disposed below the ground pad 422.

In an example, in the first column of ground pads 420, the ground pad 423 is offset from the ground pad 422 and the ground pad 423 is offset from a ground pad 424. In an example, the ground pad 422 and the ground pad 444 are offset from the ground pad 423 for substantially the same amount and in the same second direction with respect to the fourth imaginary line. In an example, the ground pad 422 and the ground pad 424 are not offset with respect to one another. In an example, the third imaginary line passes through a center of the ground pad 424. In an example, the ground pad 422 is disposed above the ground pad 423 and the ground pad 424 is disposed below the ground pad 423.

In an example, a distance D2 taken along the fourth imaginary line between the ground pad 421 and the ground pad 423 is substantially equal to a distance D2 taken along the third imaginary line between the ground pad 412 and the ground pad 424. In an example, in the first column of ground pads 420, each grouping of four successive ground pads follow the structure of the ground pads 421-424. In an example, ground pads of the second column of ground pads 440 have the same structure as the ground pads of the first column of ground pads 420.

According to an embodiment, the distance D1 is substantially equal to the distance D2.

In embodiments, a group of four pads forming a diamond shape includes one power pad and three ground pads or one ground pad and three power pads. In an example, an imaginary diamond includes power pads 411, 412, and 413, as well as ground pad 422. Thus, this group of four pads (411, 412, 413, and 422) forming the imaginary diamond includes one ground pad and three power pads. In an example, an imaginary diamond includes ground pads 422, 423, and 424, as well as power pad 413. Thus, this group of four pads (422, 423, 424, and 413) forming the imaginary diamond includes one power pad and three ground pads.

Figure 5:
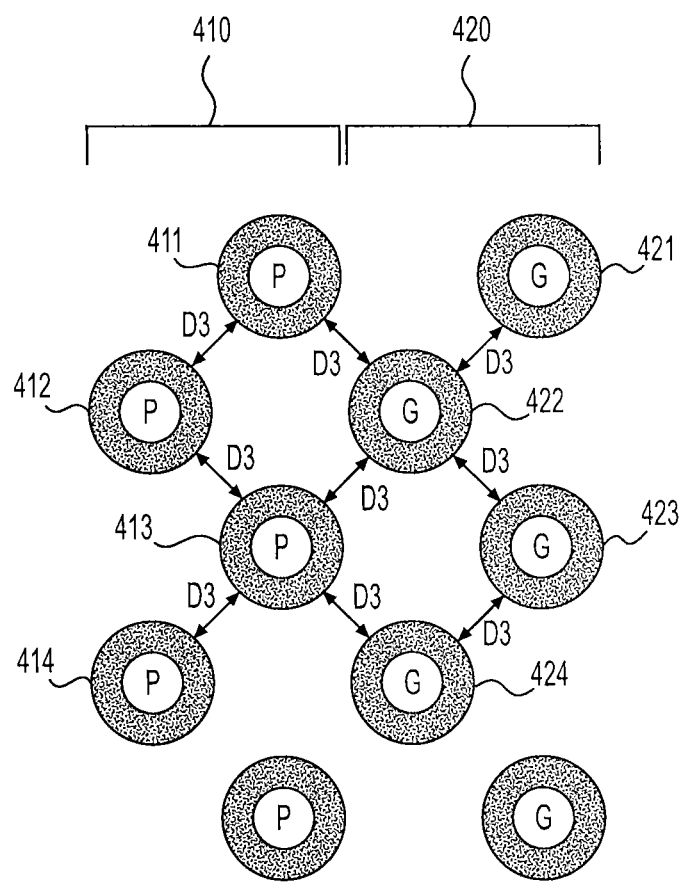
FIG. 5 shows a plan view of the plurality of pads according to an embodiment of the disclosure.

FIG. 5 shows a plan view of the plurality of pads according to an embodiment of the disclosure. In an example, the first column of power pads 410 is adjacent to the first column of ground pads 420. A pair of ground pads 422 and 424 in the first column of ground pads 420 are substantially equidistant to the power pad 413 in the adjacent first column of power pads 410. A pair of power pads 411 and 413 in the first column of power pads 410 are substantially equidistant to the ground pad 422 in the first adjacent first column of ground pads.

In an example, a distance between the power pad 411 and the ground pad 422 taken on a fifth imaginary line (not shown) passing through centers of the power pad 411 and the ground pad 422, a distance between the ground pad 422 and the power pad 413 taken on a sixth imaginary line (not shown) passing through centers of the ground pad 422 and the power pad 413, and a distance between the power pad 413 and the ground pad 424 taken on a seventh imaginary line (not shown) passing through centers of the power pad 413 and ground pad 424, are all substantially equal as D3.

In an example, a distance between the ground pads 421 and 422 taken on an eighth imaginary line (not shown) passing through centers of the ground pads 421 and 422, a distance between the ground pads 422 and 423 taken on an ninth imaginary line (not shown) passing through centers of the ground pads 422 and 423, and a distance between the ground pads 423 and 424 taken on an tenth imaginary line (not shown) passing through centers of the ground pads 423 and 424 are all substantially equal to D3.

In an example, a distance between the power pads 411 and 412 taken on an eleventh imaginary line (not shown) passing through centers of the power pads 411 and 412, a distance between the power pads 412 and 413 taken on a twelfth imaginary line (not shown) passing through centers of the power pads 412 and 413, and a distance between the power pads 413 and 414 taken on a thirteenth imaginary line (not shown) passing through centers of the power pads 413 and 414 are all substantially equal to D3.

Figure 6:
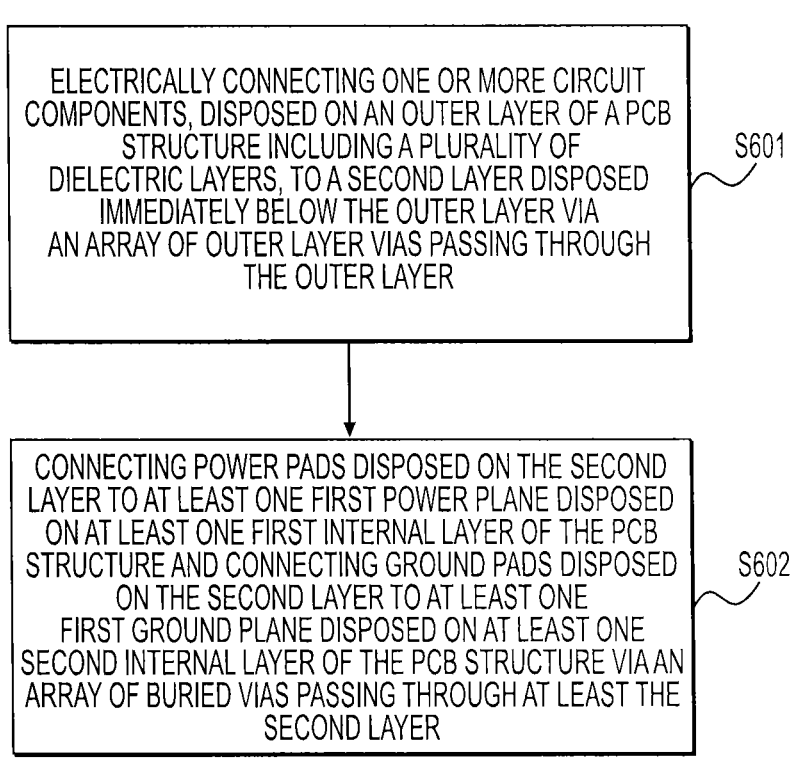
FIG. 6 shows a simplified flow chart outlining a method according to an embodiment of the disclosure.

FIG. 6 shows a simplified flow chart outlining a method according to an embodiment of the disclosure. The process starts at S601 and ends at S601.

At S601, the process includes electrically connecting the circuit components 170-1 and 170-2, disposed on the outer layer 120, to the second layer 130 via an array of the outer layer vias 230 and 240 passing through outer layer 120.

At S602, the process connects power pads 411 and 412 disposed on the second layer 130 to the power plane 260 disposed on the second internal layer 150 and connects ground pads 421 and 422 disposed on the second layer 130 to the ground plane 250 disposed on the first internal layer 140 via an array of buried vias 210 and 220.

In an embodiment, S602 includes connecting the power pads 411 and 413 of the first column of power pads 410 that are staggered with respect to the power pads 412 and 414 of the first column of power pads 410 to the power plane 260 via the array of the buried vias 210 such that the power pad 412 is offset from the power pad 411 and the power pad 412 is offset from the power pad 413.

In an example, the power pad 411 is not offset with respect to the power pad 413.

In an embodiment, S602 includes connecting the ground pads 421 and 423 of the first column of ground pads 420 that are staggered with respect to the ground pads 422 and 424 of the first column of ground pads 410 to the ground plane 250 via the array of the buried vias 220 such that the ground pad 422 is offset from the ground pad 421 and the ground pad 422 is offset from the ground pad 423.

In an example, the ground pad 421 is not offset with respect to the ground pad 423.

In an embodiment, S602 includes connecting the power pad 413 in the first column of power pads 410 to the power plane 260 via the array of the buried vias 210 such that the ground pads 422 and 424, in the first column of ground pads 420 adjacent to the first column of power pads 410, are substantially equidistant to the power pad 413.

In an embodiment, S602 includes connecting the ground pad 422 in the first column of ground pads 420 to the ground plane 250 via the array of the buried vias 220 such that the power pads 411 and 413, in the first column of power pads 410 adjacent to the first column of ground pads 420, are substantially equidistant to the ground pad 422.

In an embodiment, S602 includes connecting each of the power pads 411 and 412 to the power plane 260 via respective buried power vias 210 and connecting each of the ground pads 421 and 422 to the ground plane 250 via respective buried ground vias 220.

According the embodiments, buried power vias which are staggered with respect to each other and buried ground vias which are staggered with respect to each other are able to be placed closer to one another, thereby increasing the amount of buried vias able to be fit in the second layer 130 relative to a case where buried power vias that are not staggered with respect to each other and buried ground vias that are not staggered with respect to each other are formed in a layer. According to an example, power density provided to the second layer 130 is increased by the increased amount of buried vias. For example, the increased amount of buried vias is able to provide a path for delivering high density power and ground connections to the second layer 130. According to an example, flexibility in placing outer layer vias is increased by the increased amount of buried vias as the outer layer vias can be located where needed within the outer layer 120 while connecting to the buried vais in the second layer 130. According to an example, the increase in the amount of buried vias improves the self-inductance of the power delivery network in the PCB structure 110 relative to a case where the buried power vias and the buried ground vias are not staggered. According to an example, placing the buried power vias and the buried ground vias closer together with increased density improves mutual inductance of the power delivery network relative to a case where the buried power vias and the buried ground vias are not staggered.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. A printed circuit board (PCB) structure, comprising:
a plurality of dielectric layers including an outer layer, a second layer disposed immediately below the outer layer, and a plurality of internal layers;
at least one first power plane disposed on at least one first internal layer;
at least one first ground plane disposed on at least one second internal layer;
an array of buried vias passing through at least the second layer and configured to respectively connect power pads disposed on the second layer to the at least one first power plane and to connect ground pads disposed on the second layer to the at least one first ground plane, wherein the array of buried vias is defined by columns of pads in which a respective column includes either power pads or ground pads, columns of power pads alternate with columns of ground pads, pads of at least one of a column of power pads and a column of ground pads are staggered with respect to other pads of the at least one of the column of power pads and the column of ground pads on a plane parallel to the plurality of dielectric layers, and the array of buried vias includes:
a buried via, for each of the pads of the at least one of the column of power pads and the column of ground pads which are staggered with respect to the other pads of the at least one of the column of power pads and the column of ground pads, that extends from the pad on the second layer through the second layer to one of the at least one power plane and the at least one ground plane, and
a buried via, for each of the other pads of the at least one of the column of power pads and the column of ground pads, that extends from the other pad on the second layer through the second layer to the one of the at least one power plane and the at least one ground plane; and
an array of outer layer vias passing through the outer layer and configured to provide an electrical connection between one or more circuit components disposed on the outer layer and the second layer.

2. The PCB structure of claim 1, wherein the pads of the column of power pads are staggered with respect to the other pads of the column of power pads such that:
a power pad in the column of staggered power pads is offset from a preceding power pad in the column of staggered power pads, and
the power pad in the column of staggered power pads is offset from a subsequent power pad in the column of staggered power pads.

3. The PCB structure of claim 2, wherein the preceding power pad in the column of staggered power pads is not offset with respect to the subsequent power pad in the column of staggered power pads.

4. The PCB structure of claim 1, wherein the pads of the column of ground pads are staggered with respect to the other pads of the column of ground pads such that:
a ground pad in the column of staggered ground pads is offset from a preceding ground pad in the column of staggered ground pads, and
the ground pad in the column of staggered ground pads is offset from a subsequent ground pad in the column of staggered ground pads.

5. The PCB structure of claim 4, wherein the preceding ground pad in the column of staggered ground pads is not offset with respect to the subsequent ground pad in the column of staggered ground pads.

6. The PCB structure of claim 2, wherein for a first power pad in the column of staggered power pads, ground pads in a pair of ground pads in a column of ground pads, the column of ground pads being adjacent to the column of staggered power pads, are substantially equidistant to the first power pad.

7. The PCB structure of claim 4, wherein for a first ground pad in the column of staggered ground pads, power pads in a pair of power pads in a column of power pads, the column of power pads being adjacent to the column of staggered ground pads, are substantially equidistant to the first ground pad.

8. The PCB structure of claim 2, wherein
the pads of the column of ground pads are staggered with respect to the other pads of the column of ground pads such that:
a ground pad in the column of staggered ground pads is offset from a preceding ground pad in the column of staggered ground pads, and
the ground pad in the column of staggered ground pads is offset from a subsequent ground pad in the column of staggered ground pads,
for a first power pad in the column of staggered power pads, ground pads in a pair of ground pads in the column of staggered ground pads, the column of staggered ground pads being adjacent to the column of staggered power pads, are substantially equidistant to the first power pad, and for a first ground pad in the column of staggered ground pads, power pads in a pair of power pads in the column of staggered power pads, the column of staggered power pads being adjacent to the column of staggered ground pads, are substantially equidistant to the first ground pad.

9. The PCB structure of claim 1, further comprising:
a buried power via for each of the power pads, the buried power via being configured to connect a respective power pad to the at least one first power plane; and
a buried ground via for each of the ground pads, the buried ground via being configured to connect a respective ground pad to the at least one first ground plane.

10. The PCB structure of claim 1, further comprising:
an outer layer power via passing through the outer layer configured to contact a respective power pad on the second layer, the outer layer power via positioned within the outer layer according to a position of the one or more circuit components disposed on the outer layer and independent of a buried power via passing through the second layer corresponding to the respective power pad on the second layer; and
an outer layer ground via passing through the outer layer configured to contact a respective ground pad on the second layer, the outer layer ground via positioned within the outer layer according to the position of the one or more circuit components disposed on the outer layer and independent of a buried ground via passing through the second layer corresponding to the respective ground pad on the second layer.

11. An electronic device including the PCB structure of claim 1.

12. A method, comprising:
electrically connecting one or more circuit components, disposed on an outer layer of a printed circuit board (PCB) structure including a plurality of dielectric layers, to a second layer disposed immediately below the outer layer via an array of outer layer vias passing through the outer layer;
connecting power pads disposed on the second layer to at least one first power plane disposed on at least one first internal layer of the PCB structure and connecting ground pads disposed on the second layer to at least one first ground plane disposed on at least one second internal layer of the PCB structure via an array of buried vias passing through at least the second layer, wherein the array of buried vias is defined by columns of pads in which a respective column includes either power pads or ground pads, columns of power pads alternate with columns of ground pads, and pads of at least one of a column of power pads and a column of ground pads are staggered with respect to other pads of the at least one of the column of power pads and the column of ground pads on a plane parallel to the plurality of dielectric layers;
connecting each pad, of the pads of the at least one of the column of power pads and the column of ground pads which are staggered with respect to the other pads of the at least one of the column of power pads and the column of ground pads, to one of the at least one power plane and the at least one ground plane via a buried via that extends from the pad on the second layer through the second layer to the one of the at least one power plane and the at least one ground plane; and
connecting each pad, of the other pads of the at least one of the column of power pads and the column of ground pads, to the one of the at least one power plane and the at least one ground plane via a buried via that extends from the other pad on the second layer through the second layer to the one of the at least one power plane and the at least one ground plane.

13. The method of claim 12, wherein connecting the power pads includes connecting the pads of the column of power pads that are staggered with respect to the other pads of the column of power pads to the at least one first power plane via the array of buried vias such that:
a power pad in the column of staggered power pads is offset from a preceding power pad in the column of staggered power pads, and
the power pad in the column of staggered power pads is offset from a subsequent power pad in the column of staggered power pads.

14. The method of claim 13, wherein connecting the power pads includes connecting the pads of the column of power pads that are staggered with respect to the other pads of the column of power pads to the at least one first power plane via the array of buried vias such that the preceding power pad in the column of staggered power pads is not offset with respect to the subsequent power pad in the column of staggered power pads.

15. The method of claim 12, wherein connecting the ground pads includes connecting the pads of the column of ground pads that are staggered with respect to the other pads of the column of ground pads to the at least one first power plane via the array of buried vias such that:
a ground pad in the column of staggered ground pads is offset from a preceding ground pad in the column of staggered ground pads, and
the ground pad in the column of staggered ground pads is offset from a subsequent ground pad in the column of staggered ground pads.

16. The method of claim 15, wherein connecting the ground pads includes connecting the pads of the column of ground pads that are staggered with respect to the other pads of the column of ground pads to the at least one first power plane via the array of buried vias such that the preceding ground pad in the column of staggered ground pads is not offset with respect to the subsequent ground pad in the column of staggered ground pads.

17. The method of claim 13, wherein connecting the power pads includes connecting a first power pad in the column of staggered power pads to the at least one first power plane via the array of buried vias such that ground pads in a pair of ground pads in a column of ground pads, the column of ground pads being adjacent to the column of staggered power pads, are substantially equidistant to the first power pad.

18. The method of claim 15, wherein connecting the ground pads includes connecting a first ground pad in the column of staggered ground pads to the at least one first ground plane via the array of buried vias such that power pads in a pair of power pads in a column of power pads, the column of power pads being adjacent to the column of staggered ground pads, are substantially equidistant to the first ground pad.

19. The method of claim 13, wherein
connecting the ground pads includes connecting the pads of the column of ground pads that are staggered with respect to the other pads of the column of ground pads to the at least one first power plane via the array of buried vias such that:
a ground pad in the column of staggered ground pads is offset from a preceding ground pad in the column of staggered ground pads, and the ground pad in the column of staggered ground pads is offset from a subsequent ground pad in the column of staggered ground pads, connecting the power pads includes connecting a first power pad in the column of staggered power pads to the at least one first power plane via the array of buried vias such that ground pads in a pair of ground pads in the column of staggered ground pads, the column of staggered ground pads being adjacent to the column of staggered power pads, are substantially equidistant to the first power pad, and connecting the ground pads includes connecting a first ground pad in the column of staggered ground pads to the at least one first ground plane via the array of buried vias such that power pads in a pair of power pads in the column of staggered power pads, the column of staggered power pads being adjacent to the column of staggered ground pads, are substantially equidistant to the first ground pad.

20. The method according to claim 12, further comprising:

connecting each of the power pads to the at least one first power plane via a respective buried power via; and connecting each of the ground pads to the at least one first ground plane via a respective buried ground via.

21. The method according to claim 12, further comprising:

connecting an outer layer power via passing through the outer layer to a respective power pad on the second layer such that the outer layer power via is positioned within the outer layer according to a position of the one or more circuit components disposed on the outer layer and independent of a buried power via passing through the second layer corresponding to the respective power pad on the second layer; and connecting an outer layer ground via passing through the outer layer to a respective ground pad on the second layer such that the outer layer ground via is positioned within the outer layer according to the position of the one or more circuit components disposed on the outer layer and independent of a buried ground via passing through the second layer corresponding to the respective ground pad on the second layer.

22. The method according to claim 12, further comprising:

connecting the one or more circuit components to electric components of an electronic device.

* * * * *